(12) United States Patent
Maeda et al.

(10) Patent No.: US 7,396,704 B2
(45) Date of Patent: Jul. 8, 2008

(54) LID MADE OF RESIN FOR CASE FOR ACCOMMODATING SOLID-STATE IMAGING DEVICE AND SOLID-STATE IMAGING APPARATUS

(75) Inventors: Mitsuo Maeda, Tsukuba (JP); Tomohiro Sato, Niihama (JP); Shigehide Yoshida, Niiza (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 332 days.

(21) Appl. No.: 11/276,089

(22) Filed: Feb. 14, 2006

(65) Prior Publication Data

US 2006/0186534 A1 Aug. 24, 2006

(30) Foreign Application Priority Data

Feb. 15, 2005 (JP) ............................ P2005-037923

(51) Int. Cl.
- *H01L 21/50* (2006.01)
- *H01L 21/48* (2006.01)
- *H01L 21/44* (2006.01)
- *H01L 21/00* (2006.01)
- *H01L 23/12* (2006.01)
- *H01L 31/0203* (2006.01)
- *G02B 7/02* (2006.01)

(52) U.S. Cl. ....................... 438/127; 438/126; 438/125; 438/48; 257/704; 257/434; 359/811

(58) Field of Classification Search ................. 438/125, 438/126, 127, 48; 257/704, 434; 359/811
See application file for complete search history.

(56) References Cited

U.S. PATENT DOCUMENTS

| | | | | | |
|---|---|---|---|---|---|
| 5,329,406 | A | * | 7/1994 | Nakanishi et al. | ............ 359/811 |
| 5,975,882 | A | * | 11/1999 | Nomura et al. | ................ 451/42 |
| 5,982,565 | A | * | 11/1999 | Nomura et al. | ............. 359/819 |
| 6,144,505 | A | * | 11/2000 | Nakanishi et al. | ............ 359/811 |
| 6,437,928 | B2 | * | 8/2002 | Togashi | ...................... 359/811 |
| 6,483,030 | B1 | * | 11/2002 | Glenn et al. | ................ 174/521 |
| 6,870,259 | B2 | * | 3/2005 | Silverbrook | ................ 257/704 |

FOREIGN PATENT DOCUMENTS

JP 11-177074 A 7/1999

\* cited by examiner

*Primary Examiner*—Luan Thai
(74) *Attorney, Agent, or Firm*—Sughrue Mion, PLLC

(57) ABSTRACT

This method of manufacturing a lid made of a transparent resin comprises a step of introducing a resin into a cavity for molding a protrusion continuous with a cavity for molding a lid in a die; a step of forming a molded body including a lid and a protrusion continuous with the lid by solidifying the resin in the cavity for molding a lid and the cavity for molding a protrusion, respectively; a step of separating the molded body from the die by ejecting an ejector pin to the protrusion; and a step of separating the protrusion from the lid.

18 Claims, 8 Drawing Sheets

LID MADE OF RESIN FOR CASE FOR ACCOMMODATING SOLID-STATE IMAGING DEVICE AND SOLID-STATE IMAGING APPARATUS

BACKGROUND OF THE INVENTION

1. Field of the Invention

The present invention relates to a lid made of a resin for a case for accommodating a solid-state imaging device, a method of manufacturing the same, and a solid-state imaging apparatus.

2. Related Background Art

In general, a solid-state imaging apparatus comprises a case for accommodating a solid-state imaging device, and a transparent lid which closes the case and transmits incident light therethrough. Examples of the lid include transparent resins, transparent glass, and transparent ceramics, among which the transparent resins are advantageously used in terms of the cost, easiness in molding, etc.

It has been conventionally known a resin molding technique by using a die. In the resin molding method, a resin before solidified is injected into an inside cavity of a die, and after cooling the resin in the die, the resin molded body is pulled out from the die. This pulling out step is referred to as "protrusion". There are various methods for protrusion methods of the molded body, and typically a method by using an ejector pin has been known.

When injection-molding a resin in general, the resin is likely to flow into a gap between a die body and an ejector pin for taking the molded body out of the die, so that burrs are likely to occur in the part (ejector pin mark) ejected by the ejector pin.

FIG. 1 is a perspective view of a conventional lid 10.

Lid 10 has a lid upper surface 10a, a lid lower surface 10b and a side face part 50. A window area 60 (mirror-finished area) is formed in the center area of the lid 10. When ejecting a lid-forming part of a molded body with ejector pins at the time of injection-molding, ejector pin marks 44 are likely to remain on a surface 10a of the lid 10 in a conventional method as shown in FIG. 1, thereby generating burrs. These burrs may drop into a solid-state imaging apparatus during or after assembling the solid-state imaging apparatus, thereby causing defects in imaging.

While it has been proposed to cover a burr-generating portion with a sealant resin for burrs in a case used in a solid-state imaging apparatus (see Patent Document 1: Japanese Patent Application Laid-Open No. HEI 11-177074), for example, covering the ejector pin EP marks on the lid surface with a sealant resin makes the lid form irregular, and is inefficient in terms of cost as well.

It is an object of the present invention to provide a lid made of a resin for accommodating a solid-state imaging device, which leaves no ejector pin marks on a lid surface and is free of burrs when molding the lid made of a resin by injection molding.

SUMMARY OF THE INVENTION

In order to solve the above problem, the method of manufacturing a lid made of a resin for accommodating a solid-state imaging device comprises a molding step of integrally injection-molding from a transparent resin a molded body for a lid made of a resin comprising a lid-forming part, at least one gate part continuous with the lid-forming part, and at least one optional protrusion continuous with the lid-forming part, and a takeout step of taking the molded body out of a die by causing an ejector pin to eject the gate part and/or protrusion.

The present invention can provide a lid made of a resin for a case for accommodating a solid-state imaging device in which the solid-state imaging device is less likely to operate in error and cause defects in imaging because of dust derived from the lid, and a manufacturing method thereof.

The method of manufacturing a lid made of a transparent resin in accordance with the present invention comprises a step of introducing a resin into a cavity for molding a protrusion continuous with a cavity for molding a lid in a die; a step of forming a molded body comprising a lid and a protrusion continuous with the lid by solidifying the resin in the cavity for molding a lid and the cavity for molding a protrusion, respectively; a step of separating the molded body from the die by ejecting an ejector pin to the protrusion; and a step of separating the protrusion from the lid.

Though a trace ejected by the ejector pin is formed on the protrusion, since the protrusion is separated from the molded body, a transparent lid without the ejected trace can be obtained.

Further, it is preferable that the cavity for molding a protrusion comprise a cavity for molding a protrusion body and a cavity for molding a communicating part which communicates the cavity for molding a protrusion body and the cavity for molding a lid; and wherein a width of the cavity for molding a communicating part is narrower than that of the cavity for molding a lid.

Namely, since the width of the cavity for molding a communicating part is narrower than that of the cavity for molding a lid, the communicating part can easily be separated from the lid after molding the resin.

It is preferable that a width $a_1$ of the cavity for molding a communicating part and a length $b_1$ of the cavity for molding a communicating part satisfy the following equation:

$$0.5 \leq b_1/a_1 \leq 5.$$

It is preferable that a minimum value $d_1$ of a thickness of the cavity for molding a communicating part and a thickness c of the cavity for molding a lid satisfy the following equation:

$$0.3 \leq d_1/c \leq 1.0.$$

It is preferable that a contact area e of the ejector pin and the maximum value f of an area where the cavity for molding a lid is superimposed with a flat surface defined by a longitudinal direction and a width direction of the cavity for molding a lid satisfy the following equation:

$$0.005 \leq e/f \leq 0.03.$$

Further, the method of manufacturing a lid made of a transparent resin in accordance with the present invention comprises a step of introducing a resin through a cavity for molding a gate part continuous with a cavity for molding a lid in a die; a step of forming a molded body comprising a lid and a gate part continuous with the lid by solidifying the resin in the cavity for molding a lid and the cavity for molding a gate part, respectively; a step of separating the molded body from the die by ejecting an ejector pin to the gate part; and a step of separating the gate part from the lid.

Though a trace ejected by the ejector pin is formed on the gate part, since the gate part is separated from the molded body, a transparent lid without the ejected trace can be obtained.

The die comprises a resin introducing pore continuous with the cavity for molding a gate part; and the die has a cavity for molding another gate part at a symmetric position with respect to an axis of the resin introducing pore; and in the introducing step of a resin, the cavity for molding a gate part and the cavity for molding another gate part are filled with the resin at the same time through the resin introducing pore.

Since the cavity for molding a gate part and the cavity for molding another gate part are positioned at an axial symmetry, distortion of the die at the molding is reduced, and dimensional accuracy can be improved.

It is preferable that the cavity for molding a gate part comprise a cavity for molding a gate part body and a cavity for molding a second communicating part which communicates the cavity for molding a gate part body and the cavity for molding a lid. When the width or thickness of the cavity for molding a second communicating part is smaller than the width or thickness of the cavity for molding a lid, the communicating part can easily be separated from the lid after molding the resin.

It is preferable that a width $a_2$ of the cavity for molding a second communicating part and a length $b_2$ of the cavity for molding a second communicating part satisfy the following equation:

$$0.5 \leq b_2/a_2 \leq 5.$$

It is preferable that a minimum value $d_2$ of a thickness of the cavity for molding a second communicating part and a thickness c of the cavity for molding a lid satisfy the following equation:

$$0.3 \leq d_2/c \leq 1.0$$

DESCRIPTION OF THE PREFERRED EMBODIMENT

In the following, embodiments of the present invention will be explained in detail with reference to the drawings when appropriate.

Figure 1B:
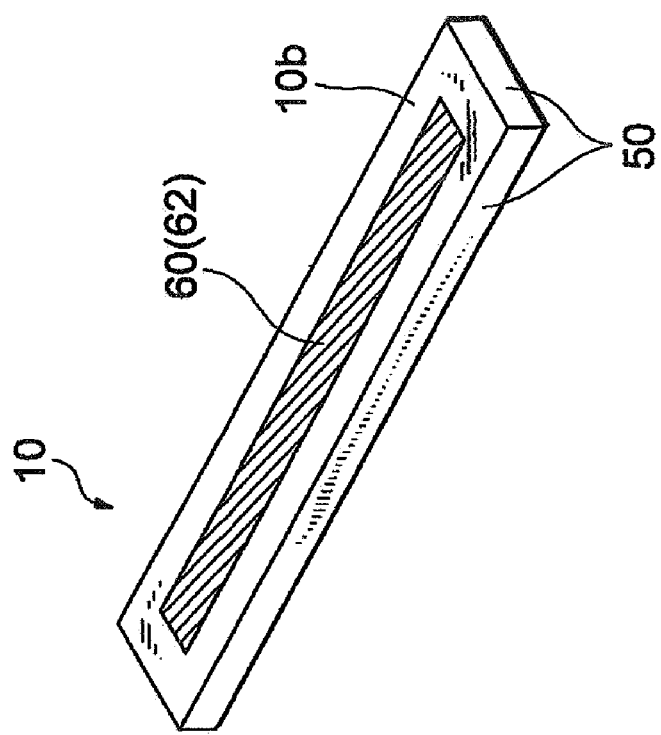
FIG. 1B is a perspective view from lower face showing the conventional lid made of a resin for a case for accommodating a solid-state imaging device.
Figure 1A:
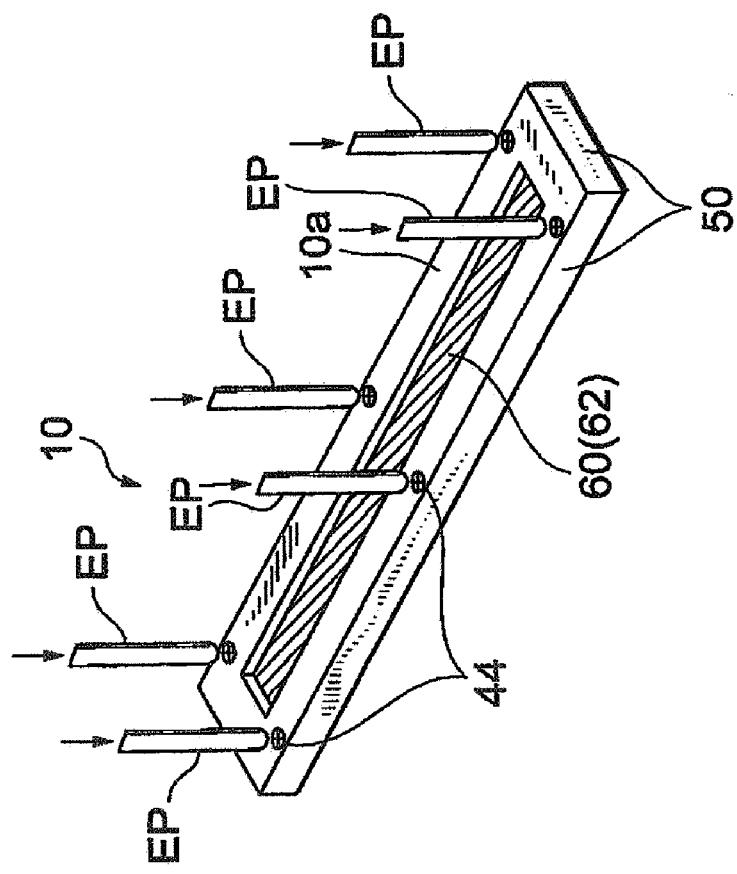
FIG. 1A is a perspective view from upper face showing a conventional lid made of a resin for a case for accommodating a solid-state imaging device.
Figure 2A:
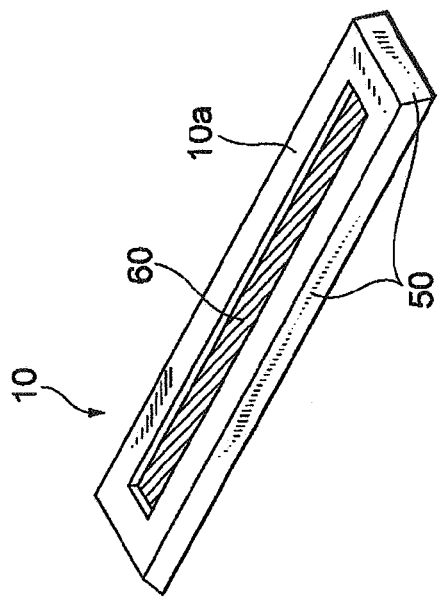
FIG. 2A is a perspective view from upper face showing a molded body of the lid made of a resin for a case for accommodating a solid-state imaging device during manufacturing.
Figure 2C:
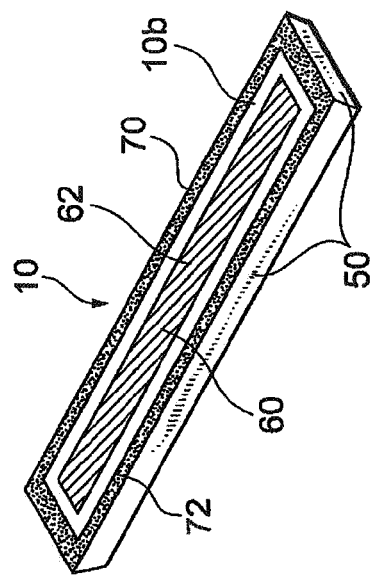
FIG. 2C is a perspective view from upper face showing the lid made of a resin for a case for accommodating a solid-state imaging device.
Figure 2B:
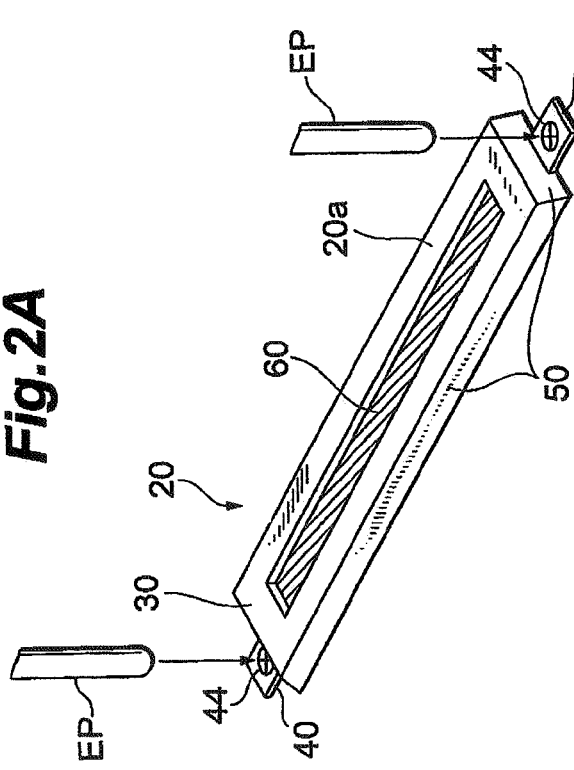
FIG. 2B is a perspective view from lower face showing the molded body of the lid made of a resin for a case for accommodating a solid-state imaging device during manufacturing.
Figure 2D:
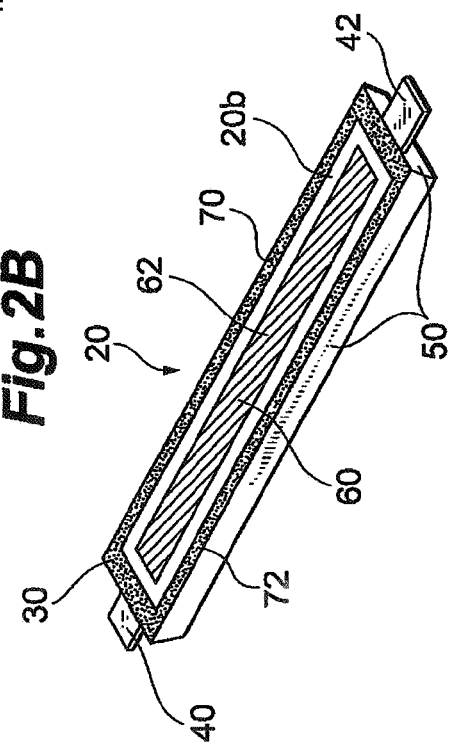
FIG. 2D is a perspective view from lower face showing the lid made of a resin for a case for accommodating a solid-state imaging device.

FIG. 2A is a perspective view from upper face showing the molded body of a lid made of a resin for a case for accommodating a solid-state imaging device during manufacturing, FIG. 2B is a perspective view from lower face showing the molded body of a lid made of a resin for a case for accommodating a solid-state imaging device during manufacturing, FIG. 2C is a perspective view from upper face showing the lid made of a resin for a case for accommodating a solid-state imaging device (after cutting a gate part and a protrusion), FIG. 2D is a perspective view from lower face showing the lid made of a resin for a case for accommodating a solid-state imaging device (after cutting the gate part and the profusion).

The method of manufacturing a lid made of a resin for a case for accommodating a solid-state imaging device (which will also be simply referred to as "a lid made of a resin" in the following) in accordance with the present invention comprises a molding step of integrally injection-molding from a transparent resin a molded body for a lid made of a resin comprising a lid-forming part 30, at least one gate part 40 continuous with the lid-forming part 30, and at least one optional protrusion 42 continuous with the lid-forming part 30; and a takeout step of taking the molded body 20 out of a die by causing an ejector pin to eject the gate part 40 and/or protrusion 42.

As shown in FIG. 2C, the "upper face" of the lid 10 or molded body 20 refers to a surface 10a on which light used for imaging is incident, whereas the "lower face" refers to a surface 10b(See FIG. 2D) which is a surface opposite from the upper face and on the side bonded to the case for accommodating a solid-state imaging device. Side face parts 50 of the lid 10 or molded body 20 refer to surfaces connecting the upper and lower faces.

The lid made of a resin in accordance with the present invention is a lid made of a transparent resin. A window area for transmitting light therethrough in the lid exhibits a transmittance of at least 80%, preferably at least 90%, with respect to incident light used for imaging, which is generally in visible (400 to 700 nm) and near-infrared regions. More preferably, the transmittance is 90% or higher at a wavelength of 400 to 800 nm. When the solid-state imaging apparatus employing the lid of the present invention is used as a barcode reader in particular, it will be preferred if the transmittance is 90% or higher at a wavelength of 650 to 660 nm.

Though the lid of the present invention can employ various forms corresponding to the form of an opening of the case for accommodating a solid-state imaging device in use and is not restricted in particular, substantially rectangular parallelepiped and substantially elliptic cylinder forms are preferred when the opening has substantially rectangular and substantially elliptic forms, respectively, for example. More preferably, a side face part of the lid is provided with a draft which will be explained later. When the opening of the case has a fittable structure, the lid may have a fitting structure in conformity to its form.

The transparent resin used in the present invention is preferably chosen from the viewpoints of transparency (light beam transmittance), heat resistance, low birefringence, low water absorption (dimension stability), and low water-vapor permeability. Its examples include acrylic resin, polycarbonate resin, cycloolefin-unit-containing polymer, styrene/acrylonitrile resin, polystyrene resin, amorphous copolyester, polyarylate (PAR), polysulfone (PSU), polyether sulfone (FES), polyether imide (PEI), amorphous fluorine-based resins, and polymer alloys mainly composed of these resins.

Among them, acrylic resin, polycarbonate resin, cycloolefin-unit-contaning polymer, and polymer alloys mainly composed of these resins are preferred. More specific examples include polymethyl methacrylate (EMMA) and norbomene-based resins.

The molded body for a lid made of a resin comprises a lid-forming part, at least one gate part continuous with the lid-forming part, and at least one optional protrusion continuous with the lid-forming part, and is integrally injection-molded by a transparent resin. The molded body is taken out of an injection-molding die when ejector pins eject the gate part and/or protrusion.

The lid-forming part is a lid body part which will finally become a lid made of a resin in the molded body obtained by injection molding. Therefore, the lid-forming part has the same form as that of the final lid made of a resin.

The gate part refers to a part to which a gate for making a resin flow into a die is connected at the time of injection molding.

The protrusion is a protruded part continuous with the lid-forming part, which is a part with which an ejector pin of an injection molding machine comes into contact when the molded body integrally formed with the lid-forming part, gate part, and protrusion is taken out of the injection-molding die.

Preferably, the molded body has at least one protrusion in order to be stably taken out of the die.

When the molded body has only the gate part, the ejector pin ejects the gate part. When the molded body has the gate part and protrusion, the ejector pin ejects the protrusion or the gate part and protrusion.

The number of positions ejected by ejector pins in the gate part and protrusion is at least 1 and the same as the number of ejector pins used at the time of injection molding, preferably 1 to 6, more preferably 2 to 4 from the viewpoints of stability in the takeout from the die and cost.

Preferably, the gate part and protrusion are provided on side face parts of the lid-forming part. When the lid has a substantially rectangular parallelepiped form, it will be more preferred from the viewpoints of suppressing defects in molding, balance in ejection, and the like if the protrusion is provided on a surface opposing the surface provided with the gate part as shown in FIG. 2A.

The form and size of the protrusion are not restricted in particular as long as it has a part ejectable by an ejector pin and such a strength that it is not broken by ejection.

Preferably, the molded body includes the protrusion in the method of manufacturing a lid made of a resin in accordance with the present invention, while the method further comprises a removing step of removing the gate part and protrusion from the taken-out molded body.

Before assembling a solid-state imaging apparatus with the lid for a case for accommodating a solid-state imaging device, the gate part and protrusion are removed. When the molded body includes parts other than the gate part and protrusion in addition to the lid-forming part, the former parts are also removed before assembling the solid-state imaging apparatus.

Preferably, the lid 10 has a draft in an ejecting direction. Namely, when ejector pins eject the molded body 20 from the die in a direction from the upper face to the lower face as shown in FIG. 2A, FIG. 2B, FIG. 2C, FIG. 2D and FIG. 3, it will be preferred if an inclination (draft) is provided in the side face parts 50 of the lid-forming part from the upper face to lower face such that the upper face becomes smaller. When the ejecting direction is from the lower face to the upper face, the inclination is vertically inverted. The above-mentioned draft makes it easier for the molded body to escape from within the die when ejector pins eject the molded body out of the die, whereby the molded body can be restrained from warping and breaking upon ejection.

Figure 3:
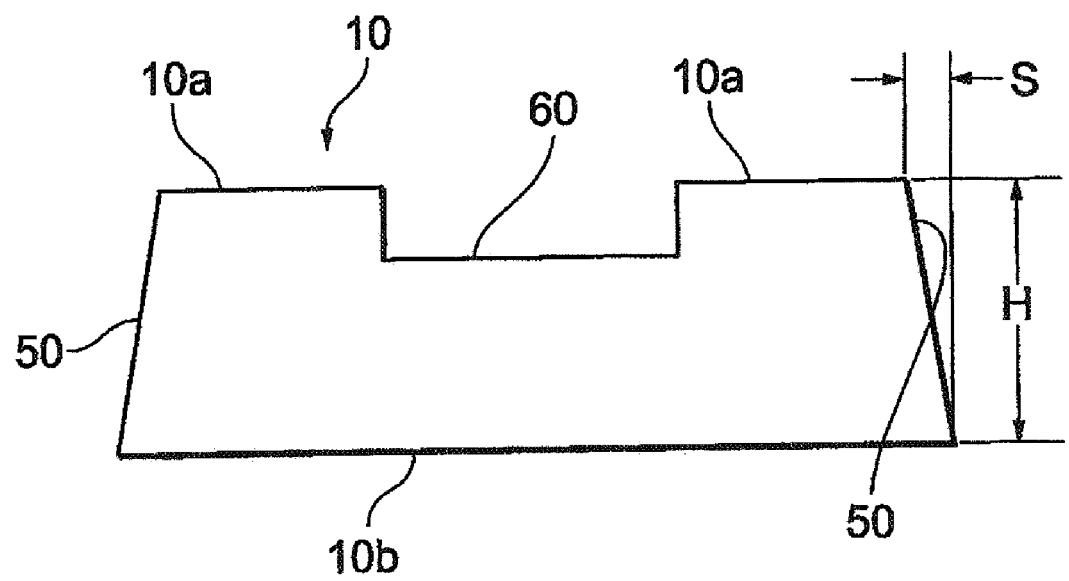
FIG. 3 is a sectional view showing an example of the lid made of a resin for a case for accommodating a solid-state imaging device in accordance with the present invention as cut at a longitudinal center part of the lid.

As shown in FIG. 3, letting H be the length of a vertical component (in the direction of the upper face to the lower face) in the inclination of the lid side face parts 50 (the distance between the upper and lower faces in the side face parts), and S be the length of a horizontal component (in a horizontal direction of the upper and lower faces) in the inclination of the lid side face parts 50, the draft can be represented by S/H. The draft S/H is preferably 1/10 to 1/100, more preferably 1/20 to 1/40.

In the present invention, the lid preferably includes a mirror-finished window area at a substantially center part of each of upper and lower faces thereof, and the lid preferably includes a satinized area in at least a part other than the window area.

The "substantially center part" is meant to include a center part and encompasses not only a completely center part but also an area having a fixed width including the center part. The "window area" refers to an area through which incident light onto an effective imaging area of the solid-state imaging device is transmitted.

An example of satinizing techniques subjects a corresponding surface of a die to electric discharge machining, which is a typical cutting operation, and carries out injection molding while using this surface as it is, whereby a surface having fine irregularities is formed on the molded body.

The lid having a mirror-finished window area in each of the upper and lower faces of the lid is excellent in transmission of incident light onto the effective imaging area of the solid-state imaging device, and can prevent the incident light from being reflected by irregularities on the lid surface and so forth, whereby the solid-state imaging apparatus can be kept from operating in error.

When a satinized area is provided in at least a part other than the window area, the incident light from the satinized area is substantially randomly reflected by the sated surface, so as to scatter to the outside of the apparatus, thus failing to reach the solid-sate imaging device, whereby the solid-state imaging apparatus can be kept from operating in error.

Preferably, the window area 60 is formed into a recess indented from the other part of the upper face 10*a* of the lid as shown in FIG. 2A and FIG. 3.

When used in the solid-state imaging apparatus, the lid 10 having the form mentioned above can prevent the window area 60 from being damaged and so forth even if an object abuts or rubs against the apparatus, whereby defects in imaging and the like can be prevented from occurring.

Preferably, in the present invention, the lid 10 has a satinized area 72 only in a bonding surface 70 with respect to the case for accommodating a solid-state imaging device in the lower face 10*b* of the lid as shown in FIG. 2D. Since the satinized surface tends to worsen the releasability from the die at the time of molding and may cause warping in the lid, its area is preferably minimized.

A solid-state imaging apparatus which closes the opening of a case for accommodating a solid-state imaging device by using the lid made of a resin in accordance with the present invention can be manufactured. The structure of the solid-state imaging apparatus (comprising a case, lead terminals, a solid-state imaging device, etc.) may employ a known configuration except for the use of the lid made of a resin in accordance with the present invention.

The case for accommodating a solid-state imaging device may be made of a resin or ceramics.

The solid-state imaging apparatus using the lid made of a resin in accordance with the present invention can favorably be used in facsimile machines, scanners, barcode readers, and TV cameras, for example.

The lid in accordance with an embodiment is more specifically explained.

Figure 4:
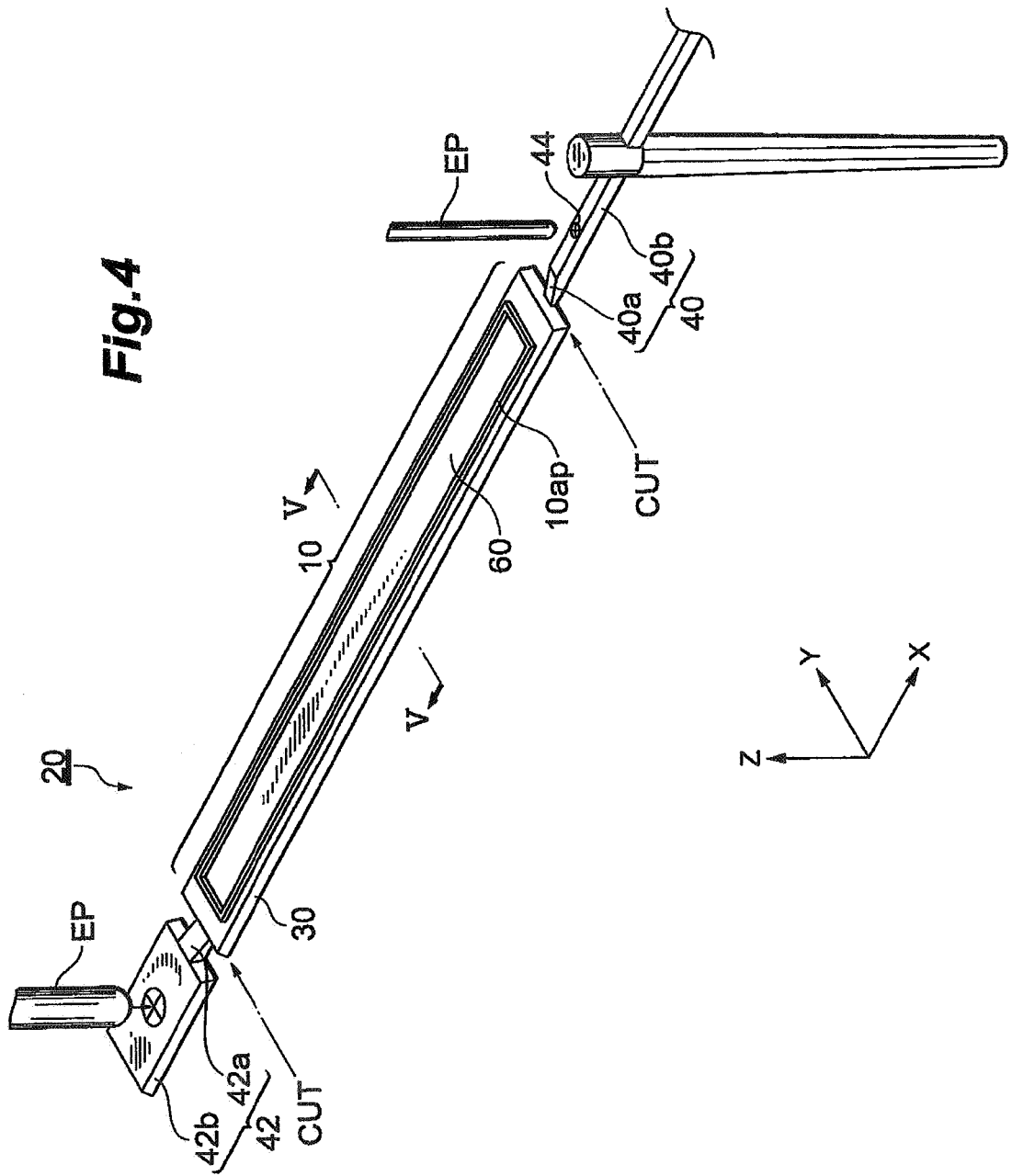
FIG. 4 is a perspective view of the lid made of a resin for a case for accommodating a solid-state imaging device in accordance with an embodiment after solidification of the resin.

FIG. 4 is a perspective view of the lid made of a resin for a case for accommodating a solid-state imaging device in accordance with an embodiment after solidification of the resin.

To one end of the lid 10 elongated to the direction X, the protrusion 42 elongated to the direction X is continued. The protrusion 42 is composed of a rectangular protrusion body 42b and a communicating part 42a which connects the protrusion body 42b and the lid 10. The thickness (direction Z) of communicating part 42a goes thinner as coming close to the lid 10, and the width is narrower than that of the protrusion body 42b, and thus cutting is easy.

To the other end of the lid 10 elongated to the direction X, the gate part 40 elongated to the direction X is continued. The gate part 40 is composed of a rectangular gate part body 40b and a communicating part 40a which connects the gate part body 40b and the lid 10. The thickness (direction Z) of communicating part 40a goes thinner as coming close to the lid 10, and the width is narrower than that of the lid 10, and thus cutting is easy.

When separating the molded body from the dies, since the protrusion body 42b and the gate part body 40b are ejected at the same time by the ejector pins EP, there remain the traces 44 on the protrusion body 42b and the gate part body 40b, respectively. When manufacturing the lid 10, since the communicating parts 42a, 40a are cut at the portions having the minimum width or minimum thickness indicated by the arrow CUT, there remains no ejected trace on the lid 10.

Figure 5:
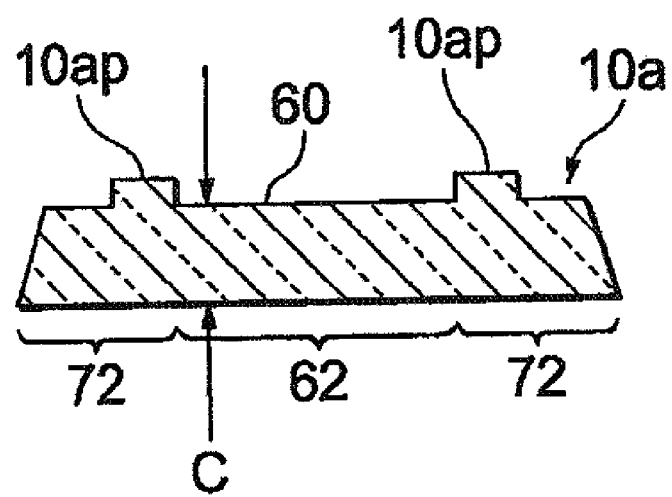
FIG. 5 is a sectional view of V-V arrow section of the lid shown in FIG. 4.

FIG. 5 is a sectional view of V-V arrow section of the lid shown in FIG. 4.

In a peripheral region of the backside of the lid 10, the surface is rendered uneven and subjected to satinized finish to form a rough surface region 72. Accordingly, when fixing by laying an adhesive between the lid and the case, the adhesive strength can be enhanced due to the presence of the rough surface region 72. A window area 60 (mirror-finished area) is formed in the center of the lid 10. Through the window area 60, light is incident to the solid-state imaging device. A thickness of the window area 60 is assumed to be a thickness c of the lid 10. Around the window area 60, a projection 10ap is formed.

Examples of the material of the lid 10 include those mentioned above, and a suitable resin material is a norbornene-based resin, this resin being excellent in heat resistance and adhesive property. Such a thermoplastic resin has a shorter curing period of time, and when employing the injection-molding, an amount of production per hour can be increased, and the waste product can be recycled.

Figure 6:
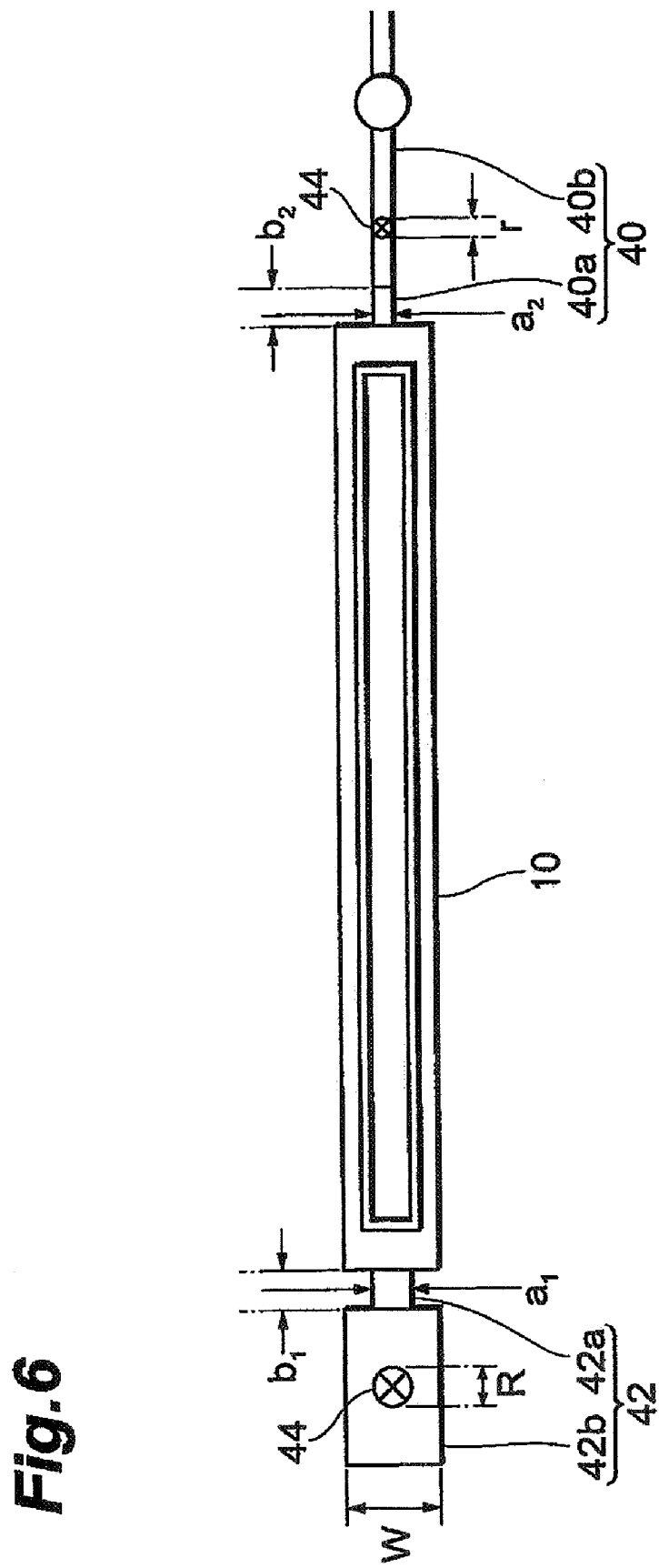
FIG. 6 is a plan view of the lid shown in FIG. 4.
Figure 7:
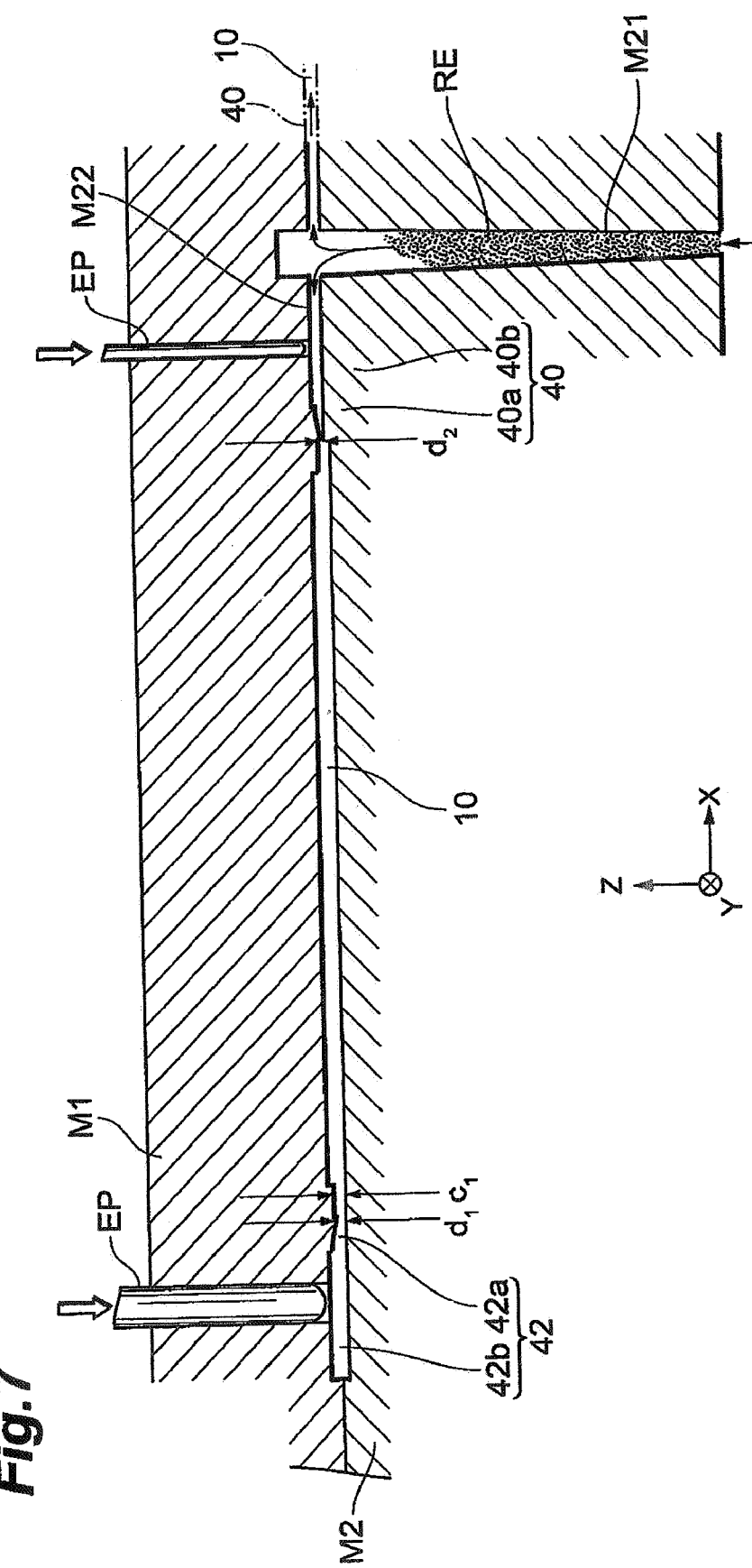
FIG. 7 is a longitudinal sectional view of a die for manufacturing the lid.

FIG. 6 is a plan view of the lid shown in FIG. 4, and FIG. 7 is a longitudinal sectional view of a die for manufacturing the lid.

The size of the finished molded body corresponds to the size of the cavity provided by the die for molding in its inside. Namely, a width $a_1$ of the communicating part 42a (the cavity for molding) and a length $b_1$ of the communicating part (the cavity for molding), the minimum value $d_1$ of a thickness of the communicating part 42a (the cavity for molding), a thickness c of the window area 60, a contact area e of the ejector pin (assuming a diameter of the trace 44 in a protrusion body 4sb being assumed to be R, $e=\pi(R/2)^2$), and the maximum value f (=the backside area of the lid) of an area where the cavity for molding a lid is superimposed with a flat surface defined by a longitudinal direction X and a width direction Y of the lid (the cavity for molding) 10 satisfies the following equations:

$$0.5 \leq b_1/a_1 \leq 5.$$

In this case, when pushing with the ejector pin EP, the molded body is easily separated from the die.

$$0.3 \leq d_1/c \leq 1.0$$

In this case, the protrusion 42 is easily cut.

$$0.005 \leq e/f \leq 0.03$$

In this case, enough force can be applied to the molded body by the ejector pin EP.

Also, it is preferable that a width $a_2$ of the second communicating part 40a (the cavity for molding), a length $b_2$ of the second communicating part 40a (the cavity for molding), the minimum value $d_2$ of a thickness of the second communicating part 40a (the cavity for molding), and a thickness c of the lid 10 (the cavity for molding) satisfy the following equations:

$$0.5 \leq b_2/a_2 \leq 5$$

In this case, when pushing with the ejector pin EP, the molded body is easily separated from the die.

$$0.3 \leq d_2/c \leq 1.0$$

In this case, the gate part 40 is easily cut.

When achieving an injection molding, a resin RE is introduced between a first die M1 and a second die M2 having a cavity of the aforementioned case shape formed between the opposing surfaces thereof. The second die M2 has a tapered resin introducing pore M21 elongated in the direction Z, and has a communicating channel M22 elongated from a top of the resin introducing pore M21 in the direction X. The top of the communicating channel M22 composes a gate part 40 (cavity for molding), and the resin RE is introduced into the cavity therethrough, and then the resin flows in the cavity along in the direction X.

After filling with the resin and solidifying, when a solidified resin is pushed toward the second die M2 with a plurality of ejector pins EP which pass through the first die M1, the molded body is separated from the dies M1, M2.

As mentioned above, this method of manufacturing a lid made of a transparent resin comprises a step of introducing the resin into the protrusion 42 (the cavity for molding) continuous with the lid 10 (the cavity for molding) in the die; a step of forming a molded body comprising the lid 10 and the protrusion 42 continuous with the lid 10 by solidifying the resin in the lid 10 (the cavity for molding) and the protrusion 42 (the cavity for molding), respectively; a step of separating the molded body from the dies M1, M2 by ejecting the ejector pin EP to the protrusion 42; and a step of cutting for separating the protrusion 42 from the lid 10.

According to the present method, though the trace 44 ejected by the ejector pin EP is formed on the protrusion 42, since the protrusion 42 is separated from the molded body, a transparent lid 10 without the ejected trace can be obtained.

The protrusion 42 (the cavity for molding) comprises the protrusion body 42b (the cavity for molding) and the communicating part 42a (the cavity for molding) which communicates the protrusion body 42b (the cavity for molding) and the lid 10 (the cavity for molding); and wherein the width $a_1$ of the communicating part 42a (the cavity for molding) is narrower than the width W of the lid 10 (the cavity for molding). Since the width $a_1$ of the communicating part 42a (the cavity for molding) is narrower than the width W of the lid 10 (the cavity for molding), the communicating part 42a can easily be separated from the lid 10 after molding the resin.

This is similar to the gate part 40.

Namely, the method of manufacturing a lid made of a transparent resin in accordance with the present invention comprises a step of introducing a resin through the gate part 40 (the cavity for molding) continuous with the lid 10 (the cavity for molding) in a die; a step of forming a molded body comprising the lid 10 and the gate part 40 continuous with the lid 10 by solidifying the resin in the lid 10 (the cavity for molding) and the gate part 40 (the cavity for molding), respectively; a step of separating the molded body from the die by ejecting the ejector pin EP to the gate part 40; and a step of separating the gate part 40 from the lid 10.

Though the trace 44 ejected by the ejector pin EP is formed on the gate part 40, since the gate part 40 is separated from the molded body, a transparent lid 10 without the ejected trace can be obtained.

The die M2 comprises a resin introducing pore M21 continuous with the gate part 40 (the cavity for molding); and the die M2 has another gate part 40 (the cavity for molding) at a symmetric position with respect to an axis (axis Z) of the resin introducing pore M21. In this case, in the introducing step of a resin, the gate part 40 (the cavity for molding) and another gate part 40 (the cavity for molding) are filled with the resin at the same time through the resin introducing pore M21.

Since the gate part 40 (the cavity for molding) and another gate part 40 (the cavity for molding) are positioned at an axial symmetry, the flowability of the resin is uniform to suppress the warping of the molded body and thus improve its dimensional accuracy. In addition, the lid 10 (the cavity for molding) has another lid 10 (the cavity for molding) at a symmetric position with respect to an axis (axis Z) of the resin introducing pore M21, and as similar to the case for gate part, the flowability of the resin becomes uniform, and thereby making it possible to suppress the warping of the molded body and to improve its dimensional accuracy.

Further, the gate part 40 (the cavity for molding) comprises the gate part body 40b (the cavity for molding) and the second communicating part 40a (the cavity for molding) which communicates the cavity for molding the gate part body 40b (the cavity for molding) and the lid 10 (the cavity for molding), and since the width or thickness of the second communicating part 40a (the cavity for molding) is smaller than the width or thickness of the lid 10 (the cavity for molding), the communicating part can easily be separated from the lid after molding the resin.

Figure 8:
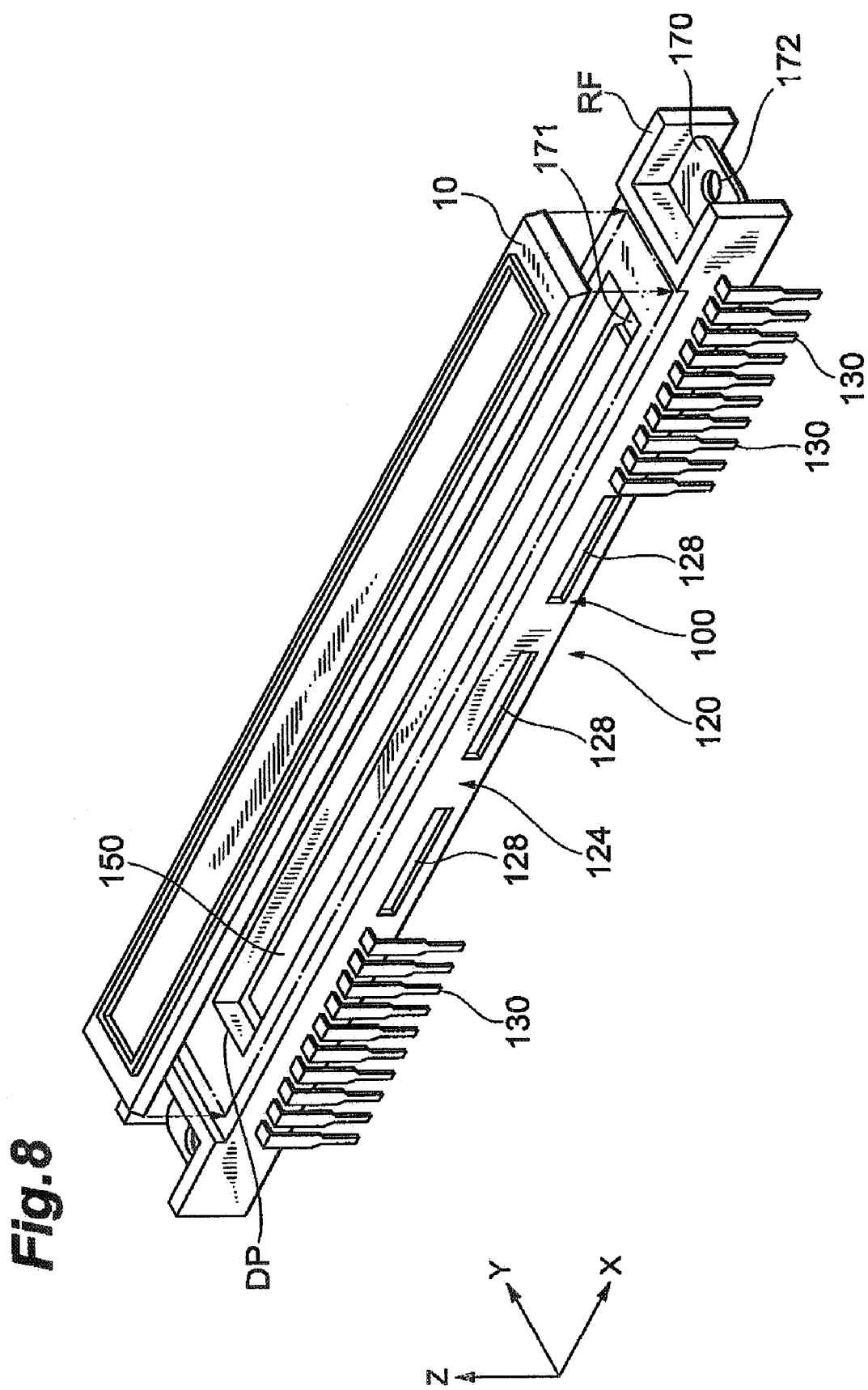
FIG. 8 is an exploded perspective view of a solid-state imaging apparatus.

FIG. 8 is an exploded perspective view of the solid-state imaging apparatus using the lid.

The solid-state imaging apparatus comprises a case 120 for accommodating a solid-state imaging device, a solid-state imaging device 150 disposed within the depression DP for accommodation, and a transparent plate (lid) 10 to close an opening of the depression DP for accommodation. The case has a high aspect ratio, and thus the solid-state imaging device 150 having a high aspect ratio is installed. This solid-state imaging device 150 is a one-dimensional CCD (line sensor). A lead terminal 130 is electrically connected to the solid-state imaging device 150 via a bonding wire.

At the both ends of a longitudinal direction of the case for accommodating a solid-state imaging device, the reinforcing parts RF are provided. The reinforcing part RF is integrally formed with the side wall 124, and projects outward from both ends of a longitudinal direction of the case body 100 along the longitudinal direction X. The sectional surface of XY section of the reinforcing part RF forms substantially U-shape together with the both ends of the case body 100. The reinforcing part RF suppresses warping and flexure in the perpendicular direction of the side wall 124.

In an inside space of the reinforcing part RF, a part of a lead frame 170 is exposed, and the lead frame 170 is connected to a die pad 171 which is mounted on the solid-state imaging apparatus 150. An opening 172 is provided on the exposed lead frame 170, and it is possible to fix the apparatus to another apparatus by inserting a pin or the like therethrough.

In the side wall 124 of the case body 100, the width direction Y is assumed to be a depth direction, and the side wall has a plurality of depressions (thinned parts) 128 elongating along the longitudinal direction X. Due to this, a flow of the resin at the time of resin molding can be homogenized, and a lighter weight can be attained.

What is claimed is:

1. A method of manufacturing a lid made of a resin for a case for accommodating a solid-state imaging device, the method comprising:
    a molding step of integrally injection-molding from a transparent resin a molded body for a lid made of a resin comprising a lid-forming part, at least one gate part continuous with the lid-forming part, and at least one optional protrusion continuous with the lid-forming part; and
    a takeout step of taking the molded body out of a die by causing an ejector pin to eject the gate part and/or protrusion.

2. A method of manufacturing a lid made of a resin for a case for accommodating a solid-state imaging device according to claim 1, wherein the molded body includes the protrusion; and
    wherein the method further comprises a removing step of removing the gate part and protrusion from the taken-out molded body.

3. A lid made of a resin for a case for accommodating a solid-state imaging device made by the method according to claim 1.

4. A lid made of a resin for a case for accommodating a solid-state imaging device according to claim 3, wherein the lid has a draft in an ejecting direction.

5. A lid made of a resin for a case for accommodating a solid-state imaging device according to claim 3, wherein the lid includes a mirror-finished window area at a substantially center part of each of upper and lower faces thereof, and a satinized area in at least a part other than the window area.

6. A lid made of a resin for a case for accommodating a solid-state imaging device according to claim 5, wherein the lid includes a satinized area only on a bonding surface in the lower face of the lid with respect to the case for accommodating the solid-state imaging device.

7. A solid-state imaging apparatus using the lid made of a resin for a case for accommodating a solid-state imaging device according to claims 3.

8. A method of manufacturing a lid made of a transparent resin, the method comprising:
    a step of introducing a resin into a cavity for molding a protrusion continuous with a cavity for molding a lid in a die;
    a step of forming a molded body comprising a lid and a protrusion continuous with the lid by solidifying the resin in the cavity for molding a lid and the cavity for molding a protrusion, respectively;
    a step of separating the molded body from the die by ejecting an ejector pin to the protrusion; and
    a step of separating the protrusion from the lid.

9. A method of manufacturing a lid made of a transparent resin according to claim 8, wherein the cavity for molding a protrusion includes a cavity for molding a protrusion body and a cavity for molding a communicating part which communicates the cavity for molding a protrusion body and the cavity for molding a lid; and wherein a width of the cavity for molding a communicating part is narrower than that of the cavity for molding a lid.

10. A method of manufacturing a lid made of a transparent resin according to claim 9, wherein a width $a_1$ of the cavity for molding a communicating part and a length $b_1$ of the cavity for molding a communicating part satisfy the following equation:

$$0.5 \leq b_1/a_1 \leq 5.$$

11. A method of manufacturing a lid made of a transparent resin according to claim 9, wherein a minimum value $d_1$ of a thickness of the cavity for molding a communicating part and a thickness c of the cavity for molding a lid satisfy the following equation:

$$0.3 \leq d_1/c \leq 1.0.$$

12. A method of manufacturing a lid made of a transparent resin according to claim 9, wherein a contact area e of the ejector pin and a maximum value f of an area where the cavity for molding a lid is superimposed with a flat surface defined by a longitudinal direction and a width direction of the cavity for molding a lid satisfy the following equation:

$$0.005 \leq e/f \leq 0.03.$$

13. A method of manufacturing a lid made of a transparent resin, the method comprising:
   a step of introducing a resin through a cavity for molding a gate part continuous with a cavity for molding a lid in a die;
   a step of forming a molded body comprising a lid and a gate part continuous with the lid by solidifying the resin in the cavity for molding a lid and the cavity for molding a gate part, respectively;
   a step of separating the molded body from the die by ejecting an ejector pin to the gate part, and
   a step of separating the gate part from the lid.

14. A method of manufacturing a lid made of a transparent resin according to claim 13, wherein the die includes a resin introducing pore continuous with the cavity for molding a gate part; wherein the die has a cavity for molding another gate part at a symmetric position with respect to an axis of the resin introducing pore; and wherein in the introducing step of a resin, the cavity for molding a gate part and the cavity for molding another gate part are filled with the resin at the same time through the resin introducing pore.

15. A method of manufacturing a lid made of a transparent resin according to claim 13, wherein the cavity for molding a gate part including a cavity for molding a gate part body and a cavity for molding a second communicating part which communicates the cavity for molding a gate part body and the cavity for molding a lid.

16. A method of manufacturing a lid made of a transparent resin according to claim 15, wherein a width $a_2$ of the cavity for molding a second communicating part and a length $b_2$ of the cavity for molding a second communicating part satisfy the following equation:

$$0.5 \leq b_2/a_2 \leq 5.$$

17. A method of manufacturing a lid made of a transparent resin according to claim 15, wherein a minimum value $d_2$ of a thickness of the cavity for molding a second communicating part and a thickness c of the cavity for molding a lid satisfy the following equation:

$$0.3 \leq d_2/c \leq 1.0.$$

18. A method of manufacturing a lid made of a transparent resin, the method comprising:
   a step of introducing a resin into and in a cavity for molding a protrusion continuous with a cavity for molding a lid in a die, and together introducing a resin through a cavity for molding a gate part continuous with the cavity for molding a lid;
   a step of forming a molded body including a lid and a protrusion and a gate part continuous with the lid by solidifying the resin in the cavity for molding a lid, the cavity for molding a protrusion and the cavity for molding a gate part, respectively;
   a step of separating the molded body from the die by ejecting an ejector pin to the protrusion and the gate part; and
   a step of separating the protrusion and the gate part from the lid.

* * * * *